United States Patent
Heckmann et al.

(10) Patent No.: US 11,955,792 B2
(45) Date of Patent: Apr. 9, 2024

(54) METHOD FOR PROTECTING AT LEAST A PART OF A NETWORK SEGMENT OF AN ELECTRICAL POWER DISTRIBUTION NETWORK

(71) Applicant: Fraunhofer-Gesellschaft zur Förderung der angewandten Forschung e.V., Munich (DE)

(72) Inventors: Wolfram Heckmann, Kassel (DE); Philipp STRAUß, Kassel (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 198 days.

(21) Appl. No.: 17/701,868

(22) Filed: Mar. 23, 2022

(65) Prior Publication Data
US 2022/0216691 A1 Jul. 7, 2022

Related U.S. Application Data

(63) Continuation of application No. PCT/EP2020/076222, filed on Sep. 21, 2020.

(30) Foreign Application Priority Data

Sep. 25, 2019 (DE) .......................... 102019214682.1

(51) Int. Cl.
*H02H 7/22* (2006.01)
*H02H 1/00* (2006.01)
(52) U.S. Cl.
CPC ............ *H02H 7/22* (2013.01); *H02H 1/0007* (2013.01)
(58) Field of Classification Search
CPC ...... G01R 31/086; H02H 1/0007; H02H 3/24; H02H 7/22; H02H 7/261; H02J 13/00007;
(Continued)

(56) References Cited

U.S. PATENT DOCUMENTS 8,059,005 B2 * 11/2011 Henricks ........... H02J 13/00036
340/636.15
8,538,708 B2 * 9/2013 Yadav ............... H02J 13/00017
702/58
(Continued)

FOREIGN PATENT DOCUMENTS

CN 105024403 A 11/2015
DE 102014223441 B4 5/2016
(Continued)

OTHER PUBLICATIONS

Matthias Hauck, "Bildung eines dreiphasigen Inselnetzes durch unabhängige Wechselrichter im Parallelbetrieb", Dissertation, Fakultät für Elektrotechnik und Informationstechnik der Universität Fridericiana Karlsruhe, 2002.
(Continued)

*Primary Examiner* — Jared Fureman
*Assistant Examiner* — Nicolas Bellido
(74) *Attorney, Agent, or Firm* — Bridgeway IP Law Group, PLLC; Jihun Kim

(57) ABSTRACT

A method for protecting at least a part of a network segment of an electrical power distribution network has: detecting voltage dips at the intermediate feeding devices of the line arrangements by the voltage dip detection devices; generating and feeding an electrical signal into the line arrangement by the signal generating device at each intermediate feeding device at which one of the voltage dips is detected, the electrical signals having frequencies different from a network frequency of the network segment; receiving the electrical signals via the line arrangements by the receiving devices of the line protection devices; detecting electrical faults on the line arrangement using the electrical signals received by the triggering device of the respective line protection device; and triggering the disconnecting device of the line protection device of the line arrangement, where an
(Continued)

electric fault is detected, by the triggering device so that the line arrangement is electrically disconnected from the further element.

9 Claims, 4 Drawing Sheets

(58) Field of Classification Search
CPC ............. H02J 13/0001; H02J 13/00034; H02J 13/0004; H02J 3/0012; Y02E 60/00; Y04S 10/20; Y04S 10/52; Y04S 40/121
See application file for complete search history.

(56) References Cited

U.S. PATENT DOCUMENTS

| | | | |
|---|---|---|---|
| 8,781,637 B2 * | 7/2014 | Eaves | H02J 3/12 |
| | | | 700/286 |
| 9,543,748 B2 * | 1/2017 | Andersen | H02H 7/26 |
| 9,564,835 B2 | 2/2017 | Chapman | |
| 11,476,701 B2 * | 10/2022 | Nishimura | H02J 9/062 |
| 2012/0203479 A1 | 8/2012 | Yadav et al. | |
| 2013/0103220 A1 * | 4/2013 | Eaves | H02H 7/261 |
| | | | 700/293 |
| 2016/0241017 A1 | 8/2016 | Schroeder et al. | |
| 2017/0328945 A1 | 11/2017 | Achanta | |

FOREIGN PATENT DOCUMENTS

| | | |
|---|---|---|
| EP | 2880731 B1 | 6/2015 |
| EP | 2929607 A2 | 10/2015 |
| WO | 2014044328 A1 | 3/2014 |

OTHER PUBLICATIONS

13. Kasseler Symposium Energie-Systemtechnik Stromrichter in Netzen, 2008, S.43.

Modulwechselrichter: Erfolgreiche Technik aus NRW, Datum: Jan. 1, 2004 10:00 Kategorie: Energie & Umwelt Pressemitteilung von: AG Solar. https://www.openpr.de/news/30290/Modulwechselrichter-Erfolgreiche-Technik-aus-NRW.html.

IEEE Guide for Protective Relaying of Utility-Consumer Interconnections ; IEEE Std C37.95-2014 (Revision of IEEE Std C37.95-2002), doi:10.1109/IEEESTD.2014.8807435, ISBN 978-0-7381-8980-2, (May 5, 2014), pp. 1-70, IEEE Standard, IEEE, Piscataway, NJ, USA, URL: https://ieeexplore.ieee.org/document/8807435, Mar. 27, 2014.

ETG—Task Force "Aktive EnergieNetze, Aktive Energienetze im Kontext der Energiewende", D3—Grenzen heutiger Schutzsysteme und mögliche Innovationen, VDE-Studie, pp. 177, 182, Feb. 2013, Frankfurt.

T.Reimann et al., "Blinding-Effekte im Niederspannungsnetz—Berücksichtung im Schutzkonzept bei dezentraler Erzeugung", Zukünftige Stromnetze für Erneuerbare Energien, Berlin, Jan. 2018, Berlin.

Forum Netztechnik/ Netzbetrieb im VDE (FNN), "Leitfaden zum Einsatz von Schutzsystemen in elektrischen Netzen", Technischer Hinweis, Sep. 2009, Berlin.

Energietechnische Gesellschaft (ETG), "Schutz- und Automatisierungstechnik in aktiven Verteilnetzen", Modul A—Schutztechnik, Informationstechnische Gesellschaft (ITG) im VDE, VED-Studie, Frankfurt, Apr. 2016.

H. Bessei et al., "Smart Fuses for Smart Grids", 10th International Conference on Electric Fuses and their Applications ICEFA, Dresden, Sep. 2015.

V. Telukunta et al., "Protection Challenges Under Bulk Penetration of Renewable Energy Resources in Power Systems: A Review", CSEE Journal of Power and Energy Systems; vol. 3, No. 4, Dec. 2017.

W. Jiang et al., "The Overview of Research on Microgrid Protection Development", International Conference on Intelligent System Design and Engineering Application, 2010.

* cited by examiner

METHOD FOR PROTECTING AT LEAST A PART OF A NETWORK SEGMENT OF AN ELECTRICAL POWER DISTRIBUTION NETWORK

CROSS-REFERENCE TO RELATED APPLICATIONS

This application is a continuation of copending International Application No. PCT/EP2020/076222, filed Sep. 21, 2020, which is incorporated herein by reference in its entirety, and additionally claims priority from German Application No. 102019214682.1, filed Sep. 25, 2019, which is also incorporated herein by reference in its entirety.

TECHNICAL FIELD

The invention relates to a method for protecting at least a part of a network segment of an electrical power distribution network. In particular, the invention relates to a method for protecting at least a part of a network segment of an electrical power distribution network comprising a line arrangement to which one or more intermediate feeding devices for feeding intermediately fed power into the respective line arrangement are connected.

In a further aspect, the invention relates to a network segment of an electrical power distribution network. In particular, the invention relates to a network segment of an electrical power distribution network comprising a line arrangement to which one or more intermediate feeding devices for feeding intermediately fed power into the respective line arrangement are connected.

BACKGROUND OF THE INVENTION

The decentralized generation and/or storage of electrical energy as well as the decentralized feeding of such energy into network segments of electrical power distribution networks is becoming increasingly important. However, this results in difficulties in protecting such network segments since electrical faults in such network segments can no longer be detected and localized reliably using conventional methods and network segments, or only with increased effort.

SUMMARY

According to an embodiment, a method for protecting at least a part of a network segment of an electrical power distribution network which has one or more line arrangements which are each connected to a supply device for supplying electrical energy to the respective line arrangement at one or more supply regions via a line protection device for protecting the respective line arrangement, each line protection device having a receiving device, a triggering device and a disconnecting device, wherein one or more intermediate feeding device for feeding intermediately fed electrical energy into the respective line arrangement and/or one or more electrical loads are connected to at least one of the line arrangements, wherein at least one of the intermediate feeding device and/or at least one of the electrical loads have a voltage dip detection device and a signal generation device, may have the steps of: detecting voltage dips at the intermediate feeding devices and/or at the electrical loads of the line arrangements by means of the voltage dip detection devices; generating and feeding an electrical signal into the respective line arrangement by means of the signal generating device at each of the intermediate feeding device and at each of the electrical loads at which one of the voltage dips is detected, the electrical signal or the electrical signals having one or more frequencies different from a network frequency of the network segment; receiving the electrical signal or the electrical signals via the line arrangements by the receiving devices of the line protection devices; detecting electrical faults on the respective line arrangement of the respective line protection device using the electrical signal received by the receiving device of the respective line protection device or the electrical signals received by the receiving device of the respective line protection device by means of the triggering device of the respective line protection device; and triggering the disconnecting device of the line protection device of the line arrangement, at which one of the electrical faults is detected, by the respective triggering device so that the respective line arrangement is electrically disconnected from the respective supply device.

Another embodiment may have a network segment of an electrical power distribution network which has one or more line arrangements which are each connected to a supply device for supplying electrical energy to the respective line arrangement at one or more supply regions via a line protection device for protecting the respective line arrangement; wherein each line protection device has a receiving device, a triggering device and a disconnecting device; wherein one or more intermediate feeding devices for feeding intermediately fed electrical energy into the respective line arrangement and/or one or more electrical loads are connected to at least one of the line arrangements; wherein at least one of the intermediate feeding devices and/or at least one of the electrical loads have a voltage dip detection device and a signal generation device; wherein the voltage dip detection devices are configured to detect voltage dips at the respective intermediate feeding device or at the respective electrical load of the line arrangements; wherein the signal generating devices are configured for generating and feeding an electrical signal into the respective line arrangement if one of the voltage dips is detected at the intermediate feeding device or the electrical load of the respective signal generating device; wherein the electrical signal or the electrical signals have one or more frequencies different from a network frequency of the network segment; wherein the receiving devices of the line protection devices are configured to receive the electrical signal or the electrical signals via the line arrangements; wherein the triggering devices are configured to detect electrical faults on the respective line arrangement of the respective line protection device using the electrical signal received by the receiving device of the respective line protection device or the electrical signals received by the receiving device of the respective line protection device; and wherein the triggering devices are configured to trigger the disconnecting device assigned thereto if one of the electrical faults is detected on the respective line arrangement of the respective line protection device so that the respective line arrangement is electrically disconnected from the respective supply device.

In a first aspect, the object is achieved by a method for protecting at least a part of a network segment of an electrical power distribution network which comprises one or more line arrangements which are each connected to a supply device for supplying electrical power to the respective line arrangement at one or more supply regions via a line protection device for protecting the respective line arrangement, wherein each line protection device has a receiving device, a triggering (or tripping) device and a disconnecting device, wherein one or more intermediate feeding devices for feeding intermediately fed electrical power into the respective line arrangement and/or one or more electrical loads are connected to at least one of the line arrangements, wherein at least one of the intermediate feeding devices and/or at least one of the electrical loads has a voltage dip detecting device and a signal generating device, the method comprising the steps of:

detecting voltage dips at the intermediate feeding devices and/or at the electrical loads of the line arrangements by means of the voltage dip detection devices;

generating and feeding an electrical signal into the respective line arrangement by means of the signal generating device at each of the intermediate feeding devices and at each of the electrical loads at which one of the voltage dips is detected, the electrical signal or signals having one or more frequencies different from a network frequency of the network segment;

receiving the electrical signal or signals via the line arrangements by the receiving devices of the line protection devices;

detecting electrical faults on the respective line arrangement of the respective line protection device using the electrical signal received by the receiving device of the respective line protection device or the electrical signals received by the receiving device of the respective line protection device by means of the triggering device of the respective line protection device; and triggering the disconnecting device of the line protection device of the line arrangement at which one of the electric faults is detected, by the respective triggering device so that the respective line arrangement is electrically disconnected from the respective feeding device.

A network segment is generally a part of an electrical power distribution network. The term "electrical power distribution network" refers both to electrical power distribution networks in the narrower sense (local or regional networks) and to electrical energy transmission networks (trans-regional networks). The network segment may in turn be divided into sub-segments. The network segment or sub-segments can be configured to transmit direct current, alternating current or three-phase current. Subsegments may carry different voltages and/or types of current. The invention is particularly suitable for medium-voltage networks with a nominal voltage between 1 kV and 60 kV and for low-voltage networks with a nominal voltage of less than 1 kV. The network segment or sub-segments can in particular have a beam topology, a ring topology or a mesh topology.

A line arrangement comprises one or more continuous linear lines which are electrically connected to one another. The lines can be single-wire or multi-wire.

The line arrangement is connected to a respective supply device for supplying electrical energy to the respective line arrangement at least at one supply region via a line protection device for protecting the respective line arrangement. The supply device can be configured in particular for supplying centrally generated electrical energy. The supply region can be formed in particular at one end of one of the lines of the line arrangement. The line protection device serves to detect an electrical fault on the line arrangement and, in the event of a detected electrical fault, to electrically disconnect the line arrangement from the supply device. An electrical fault is understood to be exceeding a permissible maximum value of the current intensity on the line arrangement. This can be triggered, for example, by a short circuit between different wires of the line arrangement, by a ground fault of at least one wire of the line arrangement or by an overload of the line arrangement. The supply device can, for example, be another line arrangement or a transformer.

At least one intermediate feeding device for feeding intermediately fed electrical energy into the respective line arrangement and/or an electrical load is connected to at least one of the line arrangements.

In some embodiments, only one or more intermediate feeding devices are connected to the respective line arrangement. In other embodiments, only one or more electrical loads are connected to the respective line arrangement. In further embodiments, one or more intermediate feeding devices and one or more electrical loads are connected to the respective line arrangement.

An intermediate feeding device is such a feeding device which feeds electrical energy directly, i.e. without an intermediate line protection device, into the line arrangement. Accordingly, the term "intermediately fed electrical energy" refers to electrical energy which is fed directly, i.e. without an intermediate line protection device, into the line arrangement. The intermediate feeding device can be configured in particular for feeding decentrally generated or stored electrical energy. The intermediate feeding device can be, in particular, a current converter which provides the intermediately fed electrical energy at the desired frequency and voltage.

An electrical load is an electrical consumer which can be supplied by the line arrangement with electrical energy supplied via the line protection device and/or with intermediately fed electrical energy. The load can be, for example, an electric drive with a current converter In this context, the term centrally generated electrical energy refers to electrical energy produced in centralized large-scale power plants with a typical capacity of over 150 MW. In contrast, the term decentrally generated electrical energy refers to electrical energy generated and/or stored in decentralized plants of smaller capacity. The decentralized plants can be, for example, photovoltaic plants, wind power plants, cogeneration plants or accumulator plants.

The intermediate feeding device and/or the electrical load comprise a voltage dip detection device which can detect a voltage dip on the line arrangement in the region of the intermediate feeding device or the electrical load. Furthermore, the intermediate feeding device and/or the electrical load comprise a signal generation device which, in the event of a detected voltage dip, generates an electrical signal which is then fed into the line arrangement. The electrical signal can be a voltage or a current. It can also be a digital electrical signal or an analog electrical signal. However, it is essential that the electrical signal has one or more frequencies different from a network frequency of the network segment so that the electrical signal can be detected on the line arrangement.

The line protection device comprises a receiving device, a triggering device and a disconnecting device. The receiving device is configured to receive the electrical signal from the intermediate feeding device. The triggering device is configured to detect electrical faults on the respective line arrangement by evaluating the signal. Furthermore, the triggering device is configured to trigger the disconnecting device in the event of a detected electrical fault on the respective line arrangement. The disconnecting device in turn is configured such that, when triggered, it disconnects the line arrangement electrically from the supply device in order to prevent or reduce the further inflow of electrical energy which could damage or even destroy the line arrangement.

The disconnecting device can be an electrical fuse. For example, remotely triggered safety fuses, electromechanical fuses, power disconnecting switches or load break switches can be used.

In known line protection devices in classic network segments, the current intensity of the energy fed into the line arrangement is measured at the line protection device. If the current intensity exceeds a maximum permissible value, an electrical fault in the line arrangement is concluded and the line protection device is triggered. This ensures that the maximum permissible current intensity on the line arrangement is not exceeded. However, if there is an intermediate feeding device for feeding intermediately fed electrical energy on the line arrangement, the current intensity of the energy fed via the line protection device and the current intensity of the intermediately fed energy are added up on the line arrangement. If there is an electrical fault, the maximum permissible current intensity on the line arrangement can be exceeded, although the current intensity at the line protection device is within the permissible range. In this case, the electrical fault cannot be detected with known line protection devices. This effect is also referred to as "blinding".

The method according to the invention avoids this disadvantage, among other things, by focusing not on the current intensity at the line protection device but on the voltage at the intermediate feeding device. This means that electrical faults on the line arrangement can be detected reliably even if intermediate feeding devices are feeding in the line arrangement.

Since the line arrangements are used to transmit the alternating signal, no separate information lines are required.

According to an advantageous further development of the invention, a depth of the respective voltage dip is always determined if the voltage dips are detected, the depth of the respective voltage dip being taken into account if one of the electrical faults on the respective line arrangement of the respective line protection device is detected.

If the network segment has several line arrangements, to each of which at least one intermediate feeding device is connected, cases are also conceivable in which an electrical fault on one of the line arrangements in many cases causes the intermediate feeding devices of different line arrangements to detect and transmit a voltage dip. This effect is also referred to as "sympathetic tripping". If the depth of the voltage dip at the respective intermediate feeding device is taken into account by the line protection devices, the latter can recognize whether the electrical fault was detected on the line arrangement assigned to it or on another line arrangement. Thus, as a rule, the voltage dip is the lowest on that line arrangement where the electrical fault occurs. In this way, the electrical fault can be localized. It is then possible for only the triggering device of the specifically affected line protection device to trigger its associated disconnecting device. In this way, the risk of faulty triggering of the disconnecting device of one of the line arrangements can be reduced further.

According to an advantageous further development of the invention, at least some of the line arrangements are stub lines which are connected, via the respective line protection devices 4, to the same supply device which is connected to a further supply device via a further line protection device, the further line protection device having a further receiving device, a further triggering device and a further disconnecting device, the disconnecting device of the further line protection device being triggered by the triggering device of the further line protection device of the further line arrangement, if one of the electrical faults on one of the stub lines is detected by the triggering device of the further line protection device using the electrical signal received by its receiving device or the electrical signals received by the receiving devices, and if it is detected by the triggering device of the further line protection device that the disconnecting device of the line protection device of the stub line at which the respective electrical fault is detected is not triggered by the triggering device 7 of the line protection device of the stub line at which the respective electrical fault is detected.

The further line protection device is set up in analogy to the line protection devices described so far. Thus, the further receiving device corresponds to the receiving devices described so far, the further triggering device corresponds to the triggering devices described so far and the further disconnecting device corresponds to the disconnecting devices described so far.

With such a hierarchical topology of the network segment, the power protection devices of the stub lines provide the main protection of the stub lines and the further power protection device provides the backup protection of the stub lines. The above features ensure that the backup protection of the stub lines takes effect if the main protection of one of the stub lines fails.

According to a practical further embodiment of the invention, each of the electrical signals is an analog alternating signal. The alternating signal may be an alternating voltage or an alternating current. However, it is essential that the alternating electrical signal has one or more frequencies different from a network frequency of the network segment so that the electrical alternating signal can be decoupled from the line arrangement, for example by using suitable filters.

The use of an analog alternating signal for information transmission from the intermediate feeding device to the line protection device has the advantage over the use of, for example, digital signals that the use of computationally complicated digital protocols or the additional communication line can be dispensed with. In addition, the information transmission can be accelerated so that the disconnecting device can be triggered without further time delay in the event of a detected electrical fault. Although the alternating signal may generate undesirable harmonics on the line arrangement, this can be accepted since the alternating signal is only transmitted in the event of a detected electrical fault.

According to a practical further development of the invention, if the voltage dips are detected, the one or more frequencies of the alternating signal, an amplitude of the alternating signal and/or a waveform of the alternating signal are determined each as a function of the depth of the respective voltage dip. In this way, the depth of the respective voltage dip can be transmitted to the line protection devices quickly and reliably.

According to a practical further development of the invention, the one or more frequencies of the alternating signals differ from at least some of the signal generating devices, wherein the detection of the electrical faults at the respective line arrangement of the respective line protection device determines and takes into account from which of the signal generating devices the respective alternating signal originates.

If the network segment has several line arrangements, to each of which at least one intermediate feeding device is connected, an electrical fault on one of the line arrangements will in many cases result in only the intermediate feeding device of the faulty line arrangement to detect and transmit a voltage dip. If the alternating signal is now designed in such a way that conclusions can be drawn as to the transmitting intermediate feeding device, the line protection devices can detect whether the electrical fault was detected on the line arrangement assigned to it or on another line arrangement. In this way, the electrical fault can be localized. It is then possible for only the triggering device of the specifically affected line protection device to trigger its assigned disconnecting device. In this way, the risk of faulty triggering of the disconnecting device of one of the line arrangements can be reduced.

According to an advantageous further development of the invention, a depth of the respective voltage dip is determined if the voltage dips are detected, wherein the one or more frequencies of the alternating signal, an amplitude of the alternating signal and/or a waveform of the alternating signal are determined as a function of the depth of the respective voltage dip, and wherein the depth of the respective voltage dip is determined and taken into account if one of the electrical faults on the respective line arrangement of the respective line protection device is detected.

If the network segment has several line arrangements, to each of which at least one intermediate feeding device is connected, cases are also conceivable in which an electrical fault on one of the line arrangements in many cases causes the intermediate feeding devices of different line arrangements to detect and transmit a voltage dip. This effect is also referred to as "sympathetic tripping". If the alternating signals of the various intermediate feeding devices are designed in such a way that conclusions can be drawn from them as to the depth of the voltage dip at the respective intermediate feeding device, the line protection devices can recognize whether the electrical fault was detected on the line arrangement assigned to them or on another line arrangement. Thus, usually the voltage dip is the lowest on that line arrangement where the electrical fault occurs. In this way, the electrical fault can be localized. It is then possible for only the triggering device of the specifically affected line protection device to trigger its associated disconnecting device. In this way, the risk of faulty tripping of the disconnecting device of one of the line arrangements can be reduced further.

In accordance with an advantageous further development of the invention, a plurality of intermediate feeding devices for feeding electrical energy into the respective line arrangement are connected to at least one of the line arrangements, wherein the one or more frequencies and phases of the alternating signals of the plurality of signal generating devices of the one of the line arrangements correspond to one another such that the alternating signals of the plurality of signal generating devices of the one of the line arrangements sum up.

In this way, the risk of a faulty triggering of the disconnecting device of one of the line arrangements can be reduced further.

According to a practical further development of the invention, each of the alternating signals has at least two frequencies, wherein the at least two frequencies are taken into account when detecting the electrical faults at the respective line arrangement of the respective line protection device. In this way, the risk of a faulty triggering of the disconnecting device of one of the line arrangements can be reduced further.

In a further aspect, the object is achieved by a network segment of an electrical power distribution network comprising one or more line arrangements, each of which is connected at one or more supply regions to a respective supply device for supplying electrical power to the respective line arrangement via a respective line protection device for protecting the respective line arrangements;

wherein each line protection device comprises a receiving device, a triggering device and a disconnecting device;

wherein one or more intermediate feeding devices for feeding intermediately fed electrical energy to the respective line and/or one or more electrical loads are connected to at least one of the line arrangements;

wherein at least one of the intermediate feeding devices and/or at least one of the electrical loads comprises a voltage dip detecting device and an alternating signal generating device;

wherein the voltage dip detecting devices are configured to detect voltage dips at the respective intermediate feeding device or at the respective electrical load of the line arrangements;

wherein the alternating signal generating devices are configured to generate and feed an electrical alternating signal to the respective line arrangement if one of the voltage dips is detected at the intermediate feeding device or at the electrical load of the respective alternating signal generating device;

wherein the electrical alternating signal or signals have one or more frequencies different from a network frequency of the network segment;

wherein the receiving devices of the line protection devices are configured to receive the electrical alternating signal or signals via the line arrangements;

wherein the triggering devices are configured to detect electrical faults on the respective line arrangement of the respective line protection device using the electrical alternating signal received by the receiving device of the respective line protection device or the electrical alternating signals received by the receiving device of the respective line protection device; and wherein the triggering devices are configured for triggering the respective disconnecting device associated therewith if one of the electrical faults is detected at the respective line arrangement of the respective line protection device so that the respective line arrangement is electrically disconnected from the respective supply device.

The advantages described above result.

BRIEF DESCRIPTION OF THE DRAWINGS

Embodiments of the present invention are described in more detail below with reference to drawings, in which.

DETAILED DESCRIPTION OF THE INVENTION

Figure 1:
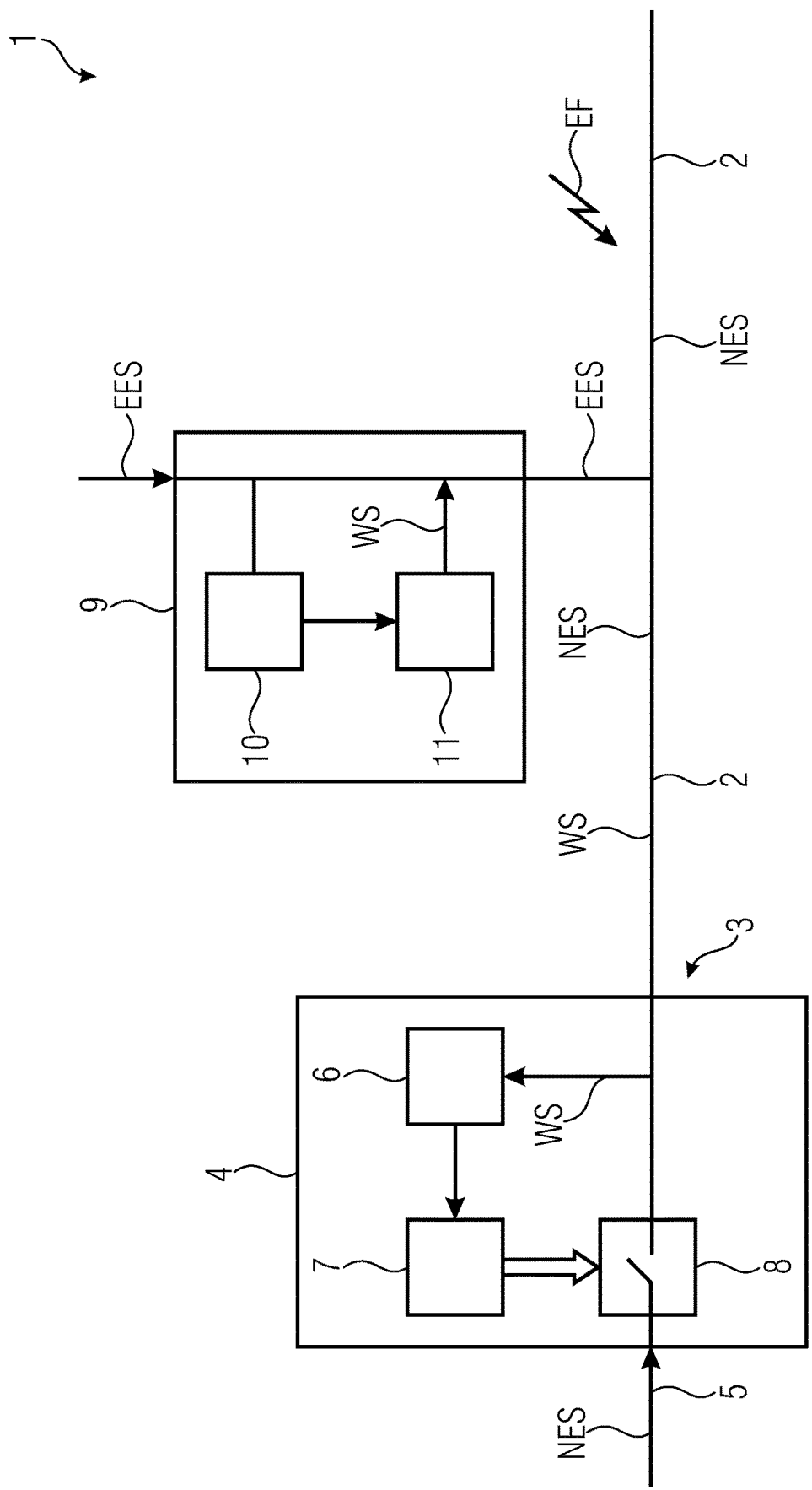
FIG. 1 shows a schematic representation of an embodiment of a network segment of an electrical power distribution network according to the invention.

Equal or similar elements or elements with the equal or equivalent function are provided with equal or similar reference numerals below.

In the following description, embodiments with a plurality of features of the present invention are described in more detail to provide a better understanding of the invention. It should be noted, however, that the present invention can also be implemented while omitting some of the features described. It should also be noted that the features shown in various embodiments can also be combined in other ways, unless this is expressly excluded or would result in contradictions.

FIG. 1 shows a schematic representation of an embodiment of an inventive network segment 1 of an electrical power distribution network, which has one or more line arrangements 2, which are each connected to one supply device 5 for supplying electrical energy NES to the respective line arrangement 2, via a line protection device 4 for protecting the respective line arrangement 2 at one or more supply regions 3;
  wherein each line protection device 4 comprises a receiving device 6, a triggering device 7 and a disconnecting device 8;
  wherein one or more intermediate feeding devices 9 for feeding intermediately fed electrical energy EES to the respective line arrangement 2 are connected to at least one of the line arrangements 2;
  wherein at least one of the intermediate feeding devices 9 comprises a voltage dip detection device 10 and a signal generating device 11;
  wherein the voltage dip detecting devices 10 are configured to detect voltage dips at the respective intermediate feeding device 9 of the line arrangements 2;
  wherein the signal generating devices 11 are configured to generate and feed an electric signal WS to the respective line arrangement 2 if one of the voltage dips is detected at the intermediate feeding device 9 or the electric load 14 of the respective signal generating device 10;
  wherein the electrical signal WS or the electrical signals WS have one or more frequencies different from a network frequency of the network segment;
  wherein the receiving devices 6 of the line protection devices 4 are configured to receive the electrical signal WS or the electrical signals WS via the line arrangements 2;
  wherein the triggering devices 7 are configured for detecting electrical faults EF on the respective line arrangement 2 of the respective line protection device 4 using the electrical signal WS received by the receiving device 6 of the respective line protection device 4 or the electrical signals WS received by the receiving device 6 of the respective line protection device 4; and
  wherein the triggering devices 7 are configured for triggering the respective disconnecting device 8 associated therewith if one of the electrical faults EF is detected at the respective line arrangement 2 of the respective line protection device 4 so that the respective line arrangement 2 is electrically disconnected from the respective supply device 5.

In the example shown in FIG. 1, the supply device 5 is implemented as a power supply line which feeds electrical energy NES into the line arrangement 2 via the line protection device 4. Furthermore, electrical energy EES intermediately fed via the intermediate feeding device 9 is fed into the line arrangement 2. It is assumed that an electrical fault EF occurs on the line arrangement 2. This means that the sum of the current intensity of the electrical energy NES supplied via the line protection device 4 and the current intensity of the electrical energy EES supplied via the intermediate feeding device 9 on the line arrangement exceeds the permissible maximum value. Whereas in a conventional network segment this fault can only be detected if the current intensity of the electrical energy NES at the line protection device exceeds the permissible maximum value, in the network segment 1 according to the invention the electrical fault EF can also be detected if this condition is not present.

The line protection device 4 with the supply device 5, the receiving device 6 and the triggering device 7, the feeding device 9 with the voltage dip detecting device 10 and the signal generating device 11 can be implemented as a combination of software and hardware components. A processor can be provided in each case.

Figure 2:
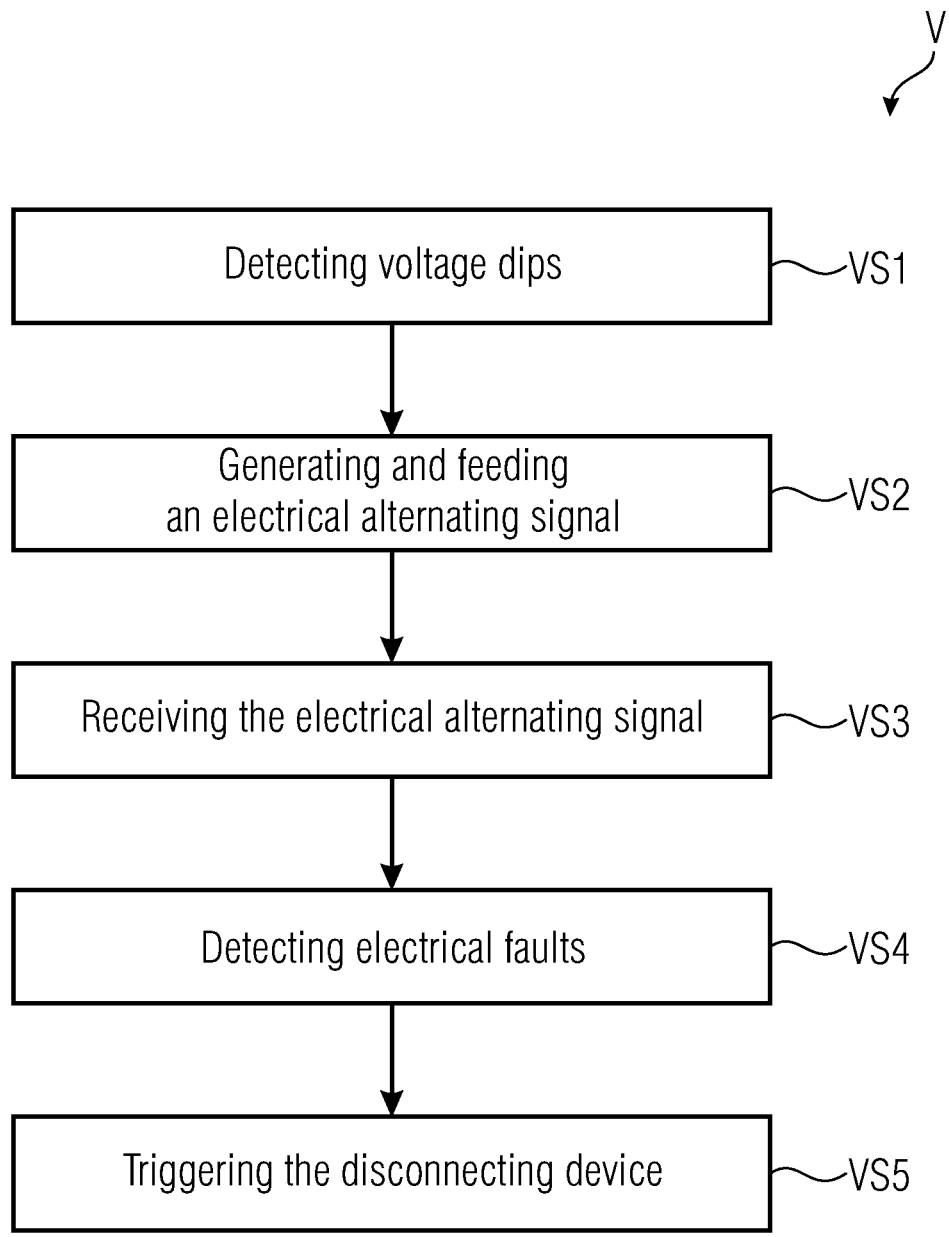
FIG. 2 shows a schematic representation of an embodiment of a method for protecting at least a part of a network segment of an electrical power distribution network according to the invention.

FIG. 2 shows a schematic representation of an embodiment of an inventive method V for protecting at least a part of a network segment 1 of an electrical power distribution network, which comprises one or more line arrangements 2, which are each connected to a supply device 5 for supplying electrical energy NES to the respective line arrangement 2 at one or more supply regions 3 via a line protection device 4 for protecting the respective line arrangement 2, each line protection device 4 comprising a receiving device 6, a triggering device 7 and a disconnecting device 8, wherein one or more intermediate feeding devices 9 for feeding intermediately fed electrical energy EES into the respective line arrangement 2 and/or at least one electrical load 14 is connected to at least one of the line arrangements 2, wherein at least one of the intermediate feeding devices 9 and/or at least one of the electrical loads 14 having a voltage dip detection device 10 and a signal generation device 11.

The method V comprises the following steps:
  Step VS1: detecting voltage dips at the intermediate feeding devices 9 and/or at the electrical loads 14 of the line arrangements 2 by means of the voltage dip detection devices 10;
  Step VS2: generating and feeding an electrical signal WS into the respective line arrangement 2 by means of the signal generating device 11 at each of the intermediate feeding devices 9 and at each of the electrical loads 14 at which one of the voltage dips is detected, the electrical signal WS or the electrical signals WS having one or more frequencies different from a network frequency of the network segment 1;
  Step VS3: receiving the electrical signal WS or the electrical signals WS via the line arrangements 2 by the receiving devices 6 of the line protection devices 4;
  Step VS4: detecting electrical faults EF on the respective line arrangement 2 of the respective line protection device 4 by means of the electrical signal WS received by the receiving device 6 of the respective line protection device 4 or the electrical signals WS received by the receiving device 6 of the respective line protection device 4 by means of the triggering device 7 of the respective line protection device 4; and
  Step VS5: triggering the disconnecting device 8 of the line protection device 4 of the line arrangement 2 at which one of the electric faults EF is detected, by the respective triggering device 7, so that the respective line arrangement 2 is electrically disconnected from the respective supply device 5.

According to a practical further development of the invention, a depth of the respective voltage dip is determined if the voltage dips are detected, the depth of the respective voltage dip being taken into account when detecting one of the electrical faults EF on the respective line arrangement 2 of the respective line protection device 4.

According to a practical further development of the invention, each of the electrical signals WS is an analog alternating signal WS.

According to a practical further development of the invention, when detecting the voltage dips, the one or more frequencies of the alternating signal WS, an amplitude of the alternating signal WS and/or a waveform of the alternating signal WS are determined as a function of the depth of the respective voltage dip.

According to an advantageous further development of the invention, the one or more frequencies of the alternating signals WS of at least some of the signal generating devices 11 differ, wherein when detecting the electrical faults EF at the respective line arrangement 2 of the respective line protection device 4, it is determined and taken into account from which of the signal generating devices 11 the respective alternating signal WS originates.

According to a practical further development of the invention, several intermediate feeding devices 9 for feeding electrical energy into the respective line arrangement 2 are connected to at least one of the line arrangements 2, wherein the one or more frequencies and phases of the alternating signals WS of the several signal generating devices 11 of the one of the line arrangements 2 correspond to one another such that the alternating signals WS of the several signal generating devices 11 of the one of the line arrangements 2 sum up.

According to an advantageous further development of the invention, each of the alternating signals WS has at least two frequencies, wherein the at least two frequencies are taken into account when detecting the electrical faults EF at the respective line arrangement 2 of the respective line protection device 4.

Figure 3:
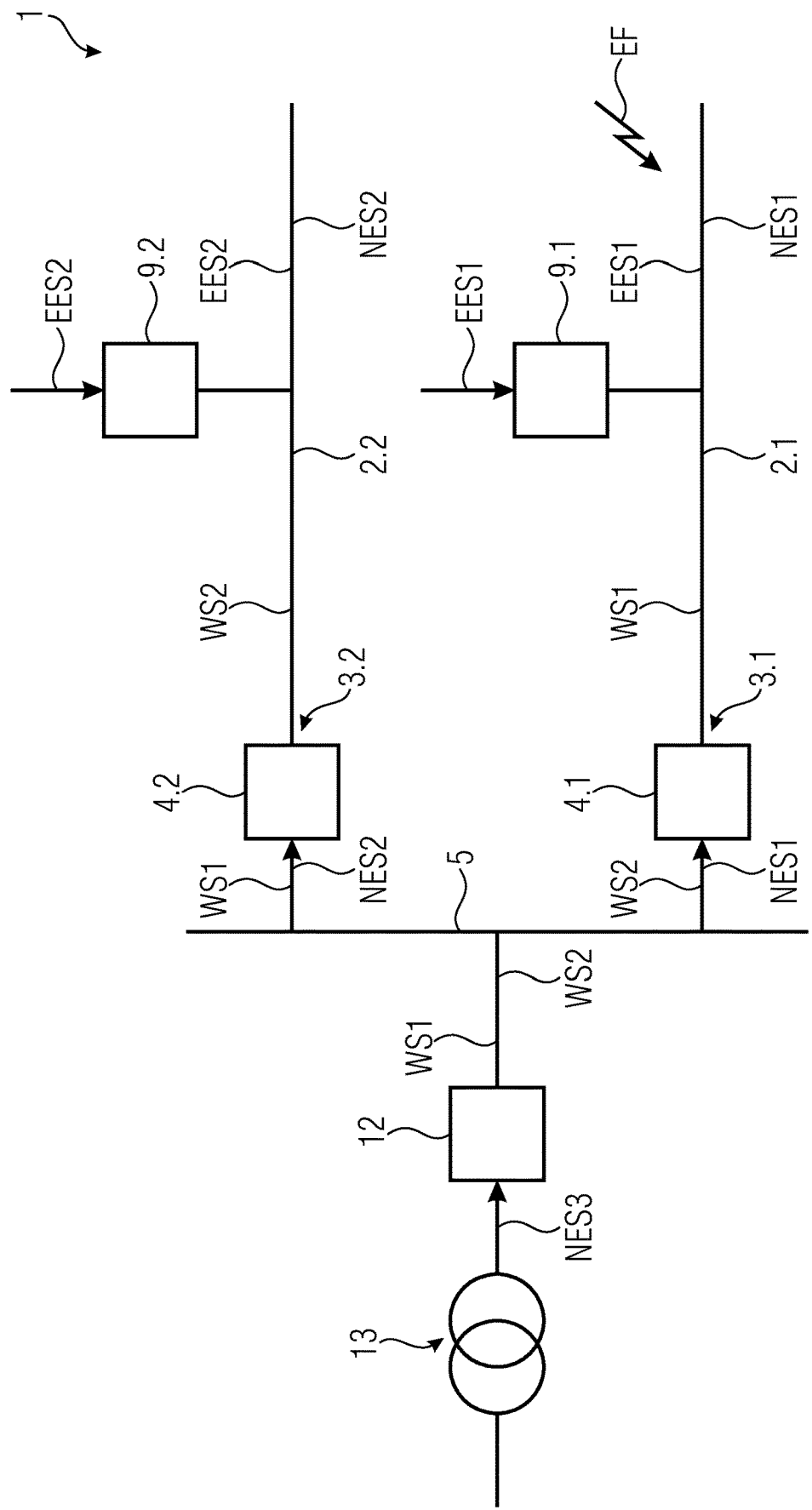
FIG. 3 shows a schematic representation of a further embodiment of a network segment of an electrical power distribution network according to the invention.

FIG. 3 shows a schematic representation of a further embodiment of an inventive network segment 1 of an electrical power distribution network.

According to a practical further development of the invention, at least some of the line arrangements 2.1; 2.2 are stub lines 2.1; 2.2, which are connected via the respective line protection devices 4.1; 4.2 to the same supply device 5 which is connected to a further supply device 13 via a further line protection device 12, the further line protection device 12 comprising a further receiving device, a further triggering device and a further disconnecting device, the disconnecting device of the further line protection device 12 being triggered by the triggering device of the further line protection device of the further line arrangement, if one of the electrical faults EF on one of the stub lines 2.1; 2.2 is detected by the triggering device of the further line protection device using the electrical signal WS1; WS2 received by its receiving device or the electrical signals WS1; WS2 received by the receiving devices, and if it is detected by the triggering device of the further line protection device that the disconnecting device of the line protection device 4.1; 4.2 of the stub line 2.1; 2.2, at which the respective electrical fault EF is detected, is not triggered by the triggering device 7 of the line protection device 4.1; 4.2 of the stub line 2.1; 2.2, at which the respective electrical fault EF is detected.

The exemplary network segment 1 of FIG. 3 comprises a line arrangement 2.1 which is connected to the supply device 5.1 via the line protection device 4.1. Furthermore, the network segment 1 comprises a line arrangement 2.2, which is also connected to the supply device 5 via the line protection device 4.2. The supply device 5 is implemented as a supply line and is connected via the further line protection device 12 to the further supply device 13, which is a transformer. The line arrangements 2.1 and 2.2 are implemented to be stub lines. The electrical energy NES3 supplied by the further supply device 13 is divided in such a way that the electrical energy NES1 is supplied to the line arrangement 2.1 and the electrical energy NES2 to the line arrangement 2.2.

The intermediate feeding device 9.1 is connected to the line arrangement 2.1 and supplies the intermediately fed electrical energy EES1 to the line arrangement 2.1. Furthermore, the intermediate feeding device 9.2 is connected to the line arrangement 2.2 and supplies the intermediately fed electrical energy EES2 to the line arrangement 2.2.

The line protection devices 4.1 and 4.2 and the further line protection device 12 correspond to the line protection device 4 of FIG. 1. Likewise, the intermediate feeding devices 9.1 and 9.2 correspond to the intermediate feeding devices 9 of FIG. 1.

Now assume that an electrical fault EF occurs on the line arrangement 2.1. In this case, the intermediate feeding device 9.1 detects a voltage dip on the line arrangement 2.1. This causes it to feed the signal WS1 into the line arrangement 2.1. The signal WS1 is then transmitted via the network segment 1 to the line protection devices 4.1 and 4.2 and to the further line protection device 12. Similarly, the intermediate feeding device 9.2 detects a voltage dip on the line arrangement 2.2, causing it to feed the signal WS2 into the line arrangement 2.2. The signal WS2 is then transmitted via the network segment 1 to the line protection devices 4.1 and 4.2 and to the further line protection device 12.

The signals WS1 and WS2 are designed in such a way that the line protection devices 4.1 and 4.2 and the line protection device 12 can assign the signal WS1 to the intermediate feeding device 9.1 and the signal WS2 to the intermediate feeding device 9.2. In addition, the signals WS1 and WS2 are designed in such a way that the line protection devices 4.1 and 4.2 and the line protection device 12 can determine the respective depth of the voltage dips on the line arrangements 2.1 and 2.2. This enables the line protection devices 4.1 and 4.2 and the line protection device 12 to detect that the electrical fault EF has occurred on the line arrangement 2.1. This results in the line protection device 4.2 not to disconnect. However, it is provided for the line protection device 4.1 to disconnect. If the line protection device 4.1 is faulty and does not disconnect, it is provided for the further line protection device 12 to disconnect.

The further line protection device 12 with the further supply device, the further receiving device and the further triggering device can be configured as a combination of software and hardware components. A processor can be provided in each case.

Figure 4:
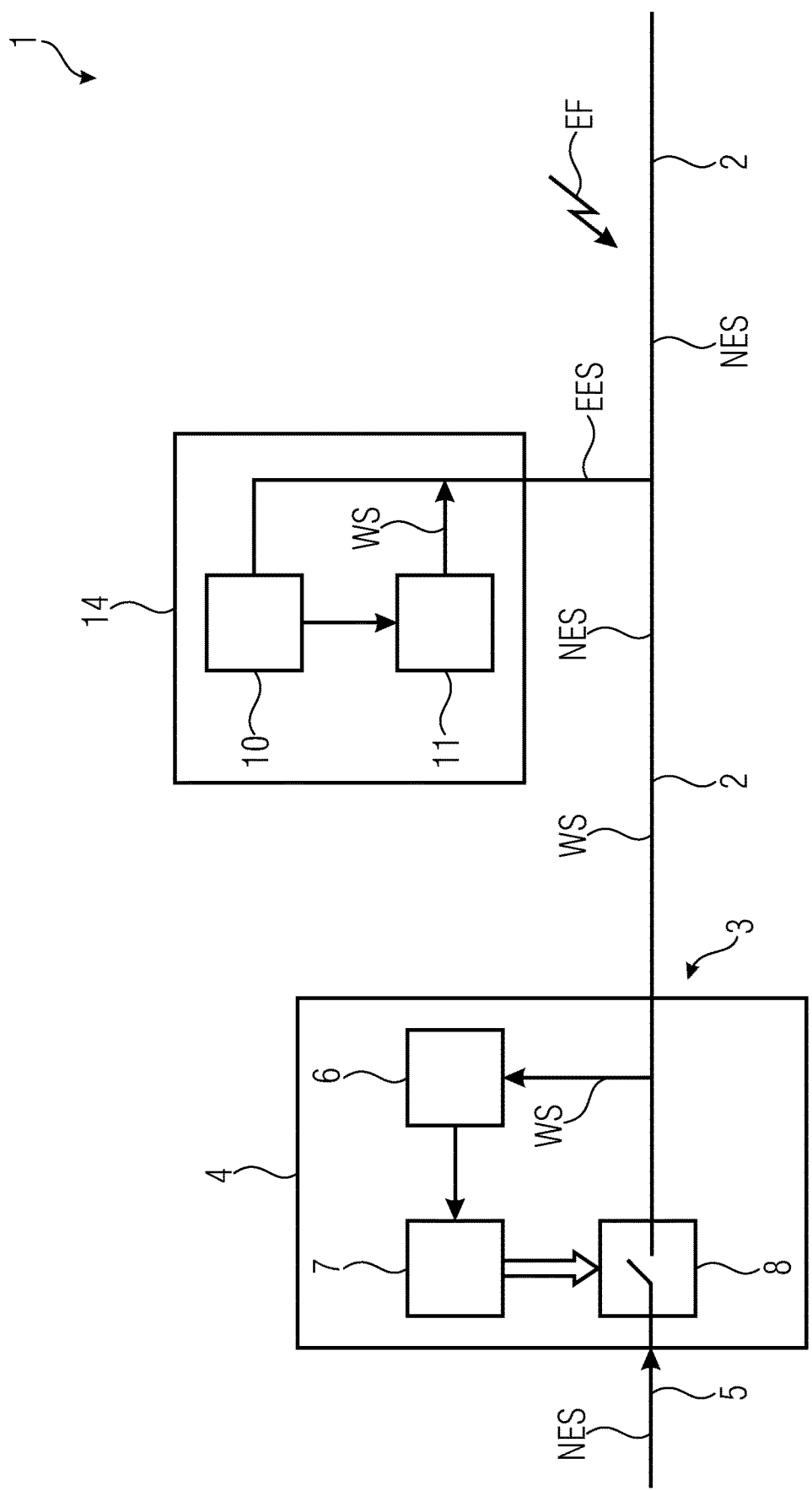
FIG. 4 shows a schematic representation of a further embodiment of a network segment of an electrical power distribution network according to the invention.

FIG. 4 shows a schematic representation of a further embodiment of an inventive network segment 1 of an electrical power distribution network which comprises one or more line arrangements 2, which are each connected to a supply device 5 for supplying electrical energy NES to the respective line arrangement 2 at one or more supply regions 3 via a line protection device 4 for protecting the respective line arrangement 2;

wherein each line protection device 4 comprises a receiving device 6, a triggering device 7 and a disconnecting device 8;

wherein one or more electrical loads 14 are connected to at least one of the line arrangements 2;

wherein at least one of the electrical loads 14 comprises a voltage dip detection device 10 and a signal generation device 11;

wherein the voltage dip detection device 10 are configured to detect voltage dips at the intermediate feeding devices 9 of the line arrangements 2;

wherein the signal generating devices 11 are configured to generate and feed an electrical signal WS to the respective line arrangement 2 if one of the voltage dips is detected at the electrical load 14 of the respective signal generating device 10;

wherein the electrical signal WS or the electrical signals WS have one or more frequencies different from a network frequency of the network segment;

wherein the receiving devices 6 of the line protection device 4 are configured to receive the electrical signal WS or the electrical signals WS via the line arrangements 2;

wherein the triggering devices 7 are configured for detecting electrical faults EF on the respective line arrangement 2 of the respective line protection device 4 using the electrical signal WS received by the receiving device 6 of the respective line protection device 4 or the electrical signals WS received by the receiving device 6 of the respective line protection device 4; and wherein the triggering devices 7 are configured for triggering the respective disconnecting device 8 associated thereto if one of the electrical faults EF is detected at the respective line arrangement 2 of the respective line protection device 4, so that the respective line arrangement 2 is electrically disconnected from the respective supply device 5.

The embodiment of FIG. 4 is based on the embodiment of FIG. 1. However, in the embodiment of FIG. 4, the voltage dip detection device 10 and the signal generation device 11 are part of an electrical load 14.

Embodiments of the proposed method or network segment for protection triggering use a decentralized detection of a voltage dip in the event of a network fault, transmission of the information to a central protection system or switching device, and assignment of specific signals to protection regions.

In one specific implementation, the characteristics of current converters for detecting voltage dips and their control capabilities are used to provide additional information to the central network protection device or to send a trigger signal to the central switching device or the fuse. This information or the trigger signal is generated actively by the current converter as a fault signal and can be evaluated by the corresponding network protection device. The method or device comprises the assignment of specific fault signals to individual protection regions, generation of a fault signal when detecting a network fault by one or more current converters and detecting this signal or these signals by one or more network protection devices.

The method supports selective fault clarification in supply networks with loads or generators connected to the network via power electronics. In particular, this method uses signals for information transmission in network protection concepts, which have at least a frequency deviating from the fundamental frequency of the electrical power supply, and suitably evaluates the information in a phase-selective manner. The functional sequence basically is as follows:

a) The current converter detects the symmetrical or asymmetrical voltage dip at the network connection point.

b) Immediately after the voltage dip is detected, the current converter feeds a signal outside the fundamental frequency onto the power line at the network connection point, e.g. one or more harmonic currents or, in the case of DC systems, any waveform.

c) To distinguish between protection regions (internal or external faults), each protection region is assigned a specific frequency or waveform. (In this way, "sympathetic tripping" can be detected and avoided, in addition to "blinding").

d) If needed, the signal is adjusted depending on the deviation of the measured voltage from the target voltage at the network connection point.

e) The network protection device or the switching device/fuse detects the signals on individual phases and evaluates them, e.g. exceeding the threshold value of specified harmonic currents, and reacts directly or depending on other indicators and parameters.

Other features of the invention include:

1) Fault signals from multiple inverters can be fed in such a way that the signals amplify one another to jointly reach a threshold.

2) In addition, the fault could be transmitted on several frequencies, e.g. to avoid false triggering by AND operation.

3) The method could also send the degree of the current converter overload instead of an error.

4) Distinguishing between main and backup protection regions by assigning protection regions to specific frequencies. Targets are a. to maintain selectivity between main and backup protection, b. to increase the speed of fault clarification by reducing the spacing of time staggering in the distribution network, c. avoidance of "sympathetic tripping" by more precise assignment of the protection regions.

5) Differentiation of the signal according to amplitude or frequency depending on the depth of the voltage dip. The aim here would be to detect the voltage gradient and thus the direction of the fault location as seen from the protection device.

The novelty of this method in network protection is the active transmission of signals, which deviate from the fundamental frequency, by resources on the power line, which can be detected and evaluated quickly by applying simple filters in the network protection device. Information are provided actively from the resources (which goes beyond a short-circuit current contribution). No additional communication lines are required, since the power lines are used for information transmission. In contrast to known methods such as Powerline Communication and ripple control, in this invention the communication is done via individual signals and not via communication protocols. In addition, no separate transmitting or receiving devices are used, which are used in PLC and ripple control.

Aspects of the invention described in connection with an apparatus also relate to corresponding methods. Conversely, aspects of the invention described in connection with a method also relate to a corresponding apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

BIBLIOGRAPHY

[1] Matthias Hauck: Bildung eines dreiphasigen Inselnetzes durch unabhängige Wechselrichter im Parallelbetrieb. (Formation of a Three-Phase Isolated Network by Independent Inverters in Parallel Operation). Dissertation, Faculty of Electrical Engineering and Information Technology, University Fridericiana Karlsruhe, 2002.
[2] DE 10 2014 223 441 B4.
[3] 13. Kasseler Symposium Energie-Systemtechnik Stromrichter in Netzen (13th Kassel Symposium on Energy Systems Technology Power Converters in Networks), 2008, p. 43.
[4] Modulwechselrichter: Erfolgreiche Technik aus NRW (Module inverters: Successful technology from NRW), Date: Jan. 1, 2004 10:00 Category: Energy & Environment Press Release by: AG Solar. https://www.openpr.de/news/30290/Modulwechselrichter-Erfol-greiche-Technik-ausNRW.html
[4] U.S. Pat. No. 9,564,835 B2.
[5] EP 2 880 731 B1.

The invention claimed is:

1. A method for protecting at least a part of a network segment of an electrical power distribution network which comprises one or more line arrangements which are each connected to a supply device for supplying electrical energy to the respective line arrangement at one or more supply regions via a line protection device for protecting the respective line arrangement, each line protection device comprising a receiving device, a triggering device and a disconnecting device, wherein one or more intermediate feeding device for feeding intermediately fed electrical energy into the respective line arrangement and/or one or more electrical loads are connected to at least one of the line arrangements, wherein at least one of the intermediate feeding device and/or at least one of the electrical loads comprise a voltage dip detection device and a signal generation device, the method comprising:

detecting voltage dips at the intermediate feeding devices and/or at the electrical loads of the line arrangements by means of the voltage dip detection devices;
    generating and feeding an electrical signal into the respective line arrangement by means of the signal generating device at each of the intermediate feeding device and at each of the electrical loads at which one of the voltage dips is detected, the electrical signal or the electrical signals comprising one or more frequencies different from a network frequency of the network segment;
    receiving the electrical signal or the electrical signals via the line arrangements by the receiving devices of the line protection devices;
    detecting electrical faults on the respective line arrangement of the respective line protection device using the electrical signal received by the receiving device of the respective line protection device or the electrical signals received by the receiving device of the respective line protection device by means of the triggering device of the respective line protection device; and
    triggering the disconnecting device of the line protection device of the line arrangement, at which one of the electrical faults is detected, by the respective triggering device so that the respective line arrangement is electrically disconnected from the respective supply device.

2. The method according to claim 1, wherein a depth of the respective voltage dip is determined when detecting the voltage dips, and wherein the depth of the respective voltage dip is taken into account when detecting one of the electrical faults on the respective line arrangement of the respective line protection device.

3. The method according to claim 2, wherein when detecting the voltage dips, the one or more frequencies of the alternating signal, an amplitude of the alternating signal, and/or a waveform of the alternating signal are determined as a function of the depth of the respective voltage dip.

4. The method according to claim 1, wherein at least some of the line arrangements are stub lines which are connected via the respective line protection devices to the same supply device which is connected to a further supply device via a further line protection device, the further line protection device comprising a further receiving device, a further triggering device and a further disconnecting device, the disconnecting device of the further line protection device being triggered by the triggering device of the further line protection device of the further line arrangement,
    if one of the electrical faults on one of the stub lines is detected by the triggering device of the further line protection device using the electrical signal received by its receiving device or the electrical signals received by the receiving devices, and
    if it is detected by the triggering device of the further line protection device that the disconnecting device of the line protection device of the stub line at which the respective electrical fault is detected is not triggered by the triggering device of the line protection device of the stub line at which the respective electrical fault is detected.

5. The method according to claim 1, wherein each of the electrical signals is an analog alternating signal.

6. The method according to claim 5, wherein the one or more frequencies of the alternating signals of at least some of the signal generating devices differ, and wherein when detecting the electrical faults at the respective line arrangement of the respective line protection device it is determined and taken into account from which of the signal generating devices the respective alternating signal originates.

7. The method according to claim 5, wherein several intermediate feeding devices for feeding electrical energy into the respective line arrangement are connected to at least one of the line arrangements, wherein the one or more frequencies and phases of the alternating signals of the several signal generating devices of the one of the line arrangements correspond to one another such that the alternating signals of the several signal generating devices of the one of the line arrangements sum up.

8. The method according to claim 5, wherein each of the alternating signals comprises at least two frequencies, and wherein the at least two frequencies are taken into account when detecting the electrical faults at the respective line arrangement of the respective line protection device.

9. A network segment of an electrical power distribution network which comprises one or more line arrangements which are each connected to a supply device for supplying electrical energy to the respective line arrangement at one or more supply regions via a line protection device for protecting the respective line arrangement;
- wherein each line protection device comprises a receiving device, a triggering device and a disconnecting device;
- wherein one or more intermediate feeding devices for feeding intermediately fed electrical energy into the respective line arrangement and/or one or more electrical loads are connected to at least one of the line arrangements;
- wherein at least one of the intermediate feeding devices and/or at least one of the electrical loads comprise a voltage dip detection device and a signal generation device;
- wherein the voltage dip detection devices are configured to detect voltage dips at the respective intermediate feeding device or at the respective electrical load of the line arrangements;
- wherein the signal generating devices are configured for generating and feeding an electrical signal into the respective line arrangement if one of the voltage dips is detected at the intermediate feeding device or the electrical load of the respective signal generating device;
- wherein the electrical signal or the electrical signals comprise one or more frequencies different from a network frequency of the network segment;
- wherein the receiving devices of the line protection devices are configured to receive the electrical signal or the electrical signals via the line arrangements;
- wherein the triggering devices are configured to detect electrical faults on the respective line arrangement of the respective line protection device using the electrical signal received by the receiving device of the respective line protection device or the electrical signals received by the receiving device of the respective line protection device; and
- wherein the triggering devices are configured to trigger the disconnecting device assigned thereto if one of the electrical faults is detected on the respective line arrangement of the respective line protection device so that the respective line arrangement is electrically disconnected from the respective supply device.

* * * * *

UNITED STATES PATENT AND TRADEMARK OFFICE
CERTIFICATE OF CORRECTION

PATENT NO. : 11,955,792 B2
APPLICATION NO. : 17/701868
DATED : April 9, 2024
INVENTOR(S) : Wolfram Heckmann et al.

It is certified that error appears in the above-identified patent and that said Letters Patent is hereby corrected as shown below:

In the Claims

On Column 15, Lines 34-49, Claim 1:
1. A method for protecting at least a part of a network segment of an electrical power distribution network which comprises one or more line arrangements which are each connected to a supply device for supplying electrical energy to the respective line arrangement at one or more supply regions via a line protection device for protecting the respective line arrangement, each line protection device comprising a receiving device, a triggering device and a disconnecting device, wherein one or more intermediate feeding device for feeding intermediately fed electrical energy into the respective line arrangement and/or one or more electrical loads are connected to at least one of the line arrangements, wherein at least one of the intermediate feeding device and/or at least one of the electrical loads comprise a voltage dip detection device and a signal generation device, the method comprising:

Should read:
1. A method for protecting at least a part of a network segment of an electrical power distribution network which comprises one or more line arrangements which are each connected to a supply device for supplying electrical energy to the respective line arrangement at one or more supply regions via a line protection device for protecting the respective line arrangement, each line protection device comprising a receiving device, a triggering device and a disconnecting device, wherein one or more intermediate feeding devices for feeding intermediately fed electrical energy into the respective line arrangement and/or one or more electrical loads are connected to at least one of the line arrangements, wherein at least one of the intermediate feeding devices and/or at least one of the electrical loads comprise a voltage dip detection device and a signal generation device, the method comprising:

Signed and Sealed this
Twenty-seventh Day of August, 2024

Katherine Kelly Vidal
*Director of the United States Patent and Trademark Office*